United States Patent [19]

Kubon et al.

[11] Patent Number: 5,002,804
[45] Date of Patent: Mar. 26, 1991

[54] CARBON BLACK COATING

[75] Inventors: Achim Kubon, Moers; Werner Kapellner, Duisburg; Ewald Schmitt, Maintal, all of Fed. Rep. of Germany

[73] Assignee: Mannesmann AG, Duesseldorf, Fed. Rep. of Germany

[21] Appl. No.: 378,007

[22] Filed: Jul. 11, 1989

[30] Foreign Application Priority Data

Jul. 11, 1988 [DE] Fed. Rep. of Germany ....... 3823768

[51] Int. Cl.$^5$ ................................................ B05D 3/08
[52] U.S. Cl. .................................... 427/224; 427/249; 427/377
[58] Field of Search ..................... 427/248.1, 423, 377, 427/249, 224

Primary Examiner—Bernard Pianalto
Attorney, Agent, or Firm—Ralf H. Siegemund

[57] ABSTRACT

A method of coating a surface expected to come in contact with liquid metal particularly steel under utilization of combusting gases and producing a soot layer possibly under reducing conditions is improved by a post deposit treatment including a flame which may oxidize but does not reduce the soot layer for reducing the size of the particles to thereby compact, strengthen and increase adhesion of the layer.

4 Claims, 1 Drawing Sheet

CARBON BLACK COATING

BACKGROUND OF THE INVENTION

The present invention relates to coating surfaces which may come into contact with liquid metal particularly steel and more particularly the invention relates to the coating of such surfaces with soot or carbon black under utilization of combustion of combustible gas yielding the deposit.

It is known to provide surfaces of workpieces with a coating of soot or carbon black when the particular surface may and is expected to come in contact with liquid metal such as steel. A typical example here is a mold for continuous casting. The soot to be deposited is usually developed by a flame resulting from the combustion of a gas blend containing acetylene while the flame is directed to the surface to be coated. The resulting soot particles will in fact deposit onto that surface.

The specific purpose of such a soot and carbon black layer is to reduce on one hand the wear of the surface of the mold wall or the like while on the other hand the soot layer facilitates separation of the casting ingot from the mold and its walls and surfaces. In addition, the soot particles prevent penetration (or are supposed to prevent) of liquid metal into the mold particularly into any cracks or fissures, separation gaps and so forth, as may be in the part.

The soot and carbon black layers made in accordance with the known method are only of limited use since it was found that no matter how carefully they are worked there is a certain nonuniformity in thickness. Unfortunately also, a soot layer does not adhere very well for any solid surface and may readily separate from such a surface on which it has been deposited. Here it has been attempted to improve adhesion of the soot layer to the substrate by adding some kind of drive or propellant gas to the organic gas blend that is combusted. The driving or propelling gas in effect causes the gas molecules and particles as they are developed in the flame, to be directed towards the surface to be coated at an increased speed. This way the soot layer is deposited in a more forceful depositing process and it was found that the quality as far as adhesion is concerned is indeed improved. However, that is only one advantage; the other drawbacks remain.

It was found otherwise that developments in the field of continuous casting, particularly casting of strip or other flat ingots made of steel and if made conventionally while being provided with a soot layer at a strip thickness from half to 40 mm are simply not adequately provided for in that fashion. On casting steel strip in the stated thickness range a so called cooling strip is used upon which the steel is deposited. The cooling strip is made of steel and has the function of its designation. In order to avoid welding of the liquid steel with the cooling strip which is cooled from the underside, it is necessary to provide that cooling strip with coating that prevents such a welding. It is believed that presently no known method exists by means of which a durable layer can be provided under utilization of hardening, nitrating, oxidizing or under utilization of spray depositing, weld depositing, bonding, adhering etc.

DESCRIPTION OF THE INVENTION

It is an object of the present invention to provide a new and improved protective layer or surface parts that come in contact with liquid metal, particularly steel;

It is another object of the present invention to improve the casting process of metal, particularly steel;

It is a further object of the present invention to improve so called cooling strips as they are used in casting;

It is a feature of the present invention to improve just a carbon layers that have been made by a flame depositing process.

It was now suprisingly found that the soot layer which is able to withstand any wear that occurs e.g. during casting of steel into strip stock, will in fact perform if on one hand this layer of soot is deposited in a conventional manner but is subjected to a post treatment being comprised of providing a neutral that is neither oxidizing nor reducing flame on that soot layer except in instances of controlling a sizing or removal process that reduces possibly locally the thickness of the soot layer. This way one obtains a significant strengthening and solidification (compacting) of the layer.

It was found that the drawbacks of known soot layers are the result of large differences in configuration of the soot particles. This is particularly true in terms of size and distribution as well as in the resulting layer thickness as a whole as well as locally. This neutral flame eliminates and homogenizes the layer of soot as to all these aspects. The posttreated soot layer assumes a considerably higher density that it had before and that in turn stops liquid metal from penetrating the layer. In other words the soot particles are even though on a microscopic scale, rather coarse and through the flame treatment they are reduced and divided in half or smaller and thus compacted while adhesibility of the layer to the base or substrate such as a cooling strip made of steel readily improves. The soot particles are smaller and therefore denser as far as density is concerned.

All these various features and aspects work together which actually becomes visible in that the surface layer of the soot changes from a dull black to a high sheen and specular reflection. It becomes almost comparable to the black lacquer used for automobiles and this specular reflectivity is of course immediately and directly indicative of surface smoothness which has been optimized in fact by the postdepositing process as now. One obtains in fact a high grade finish in the surface without any roughness.

DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

Figure 1:
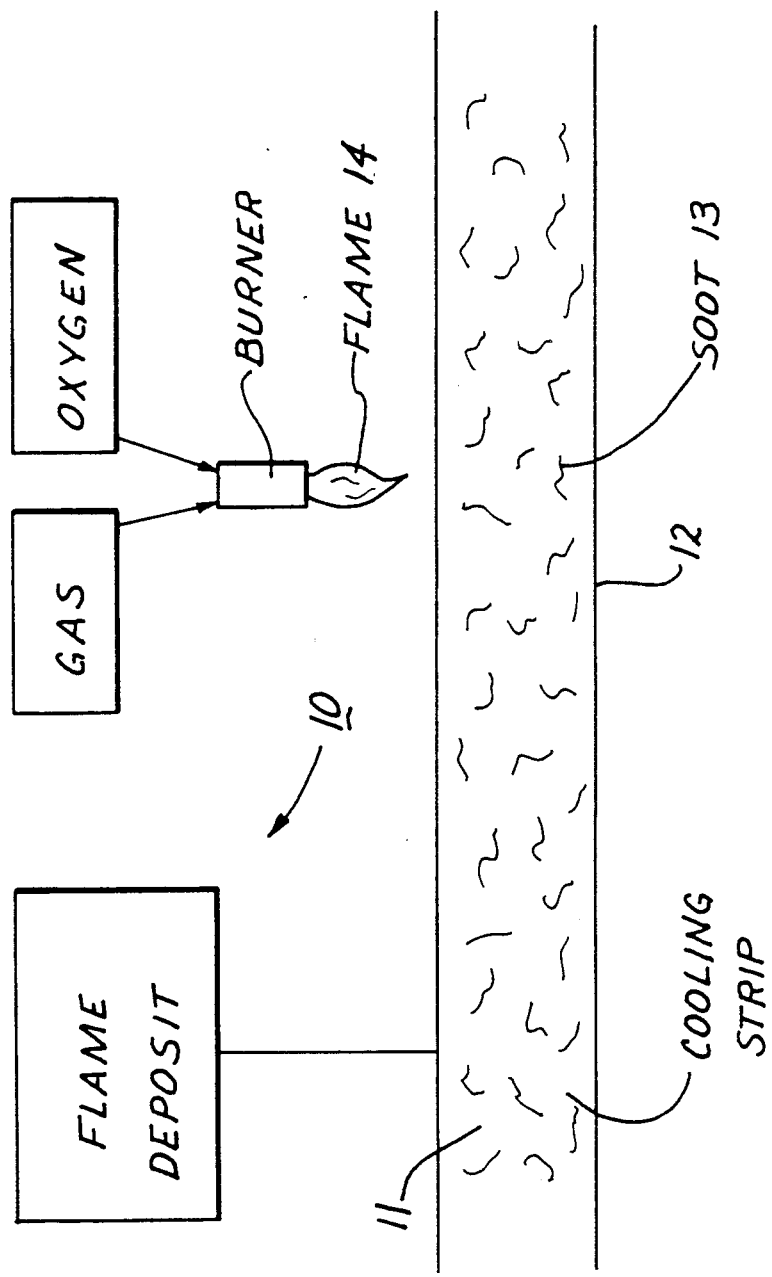
FIG. 1 shows a depositing process 10 for carbon black or soot and affecting the surface 11 of a cooling strip 12. A flame 14 posttreats the carbon coating 13 or strip 12. The posttreatment may be by a neutral flame 14. A completely neutral post treatment of course provides neither for adding of soot nor removal, at least in the ideal case. In order to make sure that this is so, one should use as a gas for producing the flame a blend of a gas that splits off carbon such as a combustible gas such as acetylene and upon reacting with oxygen the oxygen content of the gas is exactly stoichiometrically related to the carbon content of acetylene. This way one does indeed provide for a completely neutral effect of the gases as far as the ambiance is concerned. In other words by making combustion stoichiometrically as much as possible carbon will not be burned off nor will excess carbon be deposited by this post treatment.

The flame has as stated the primary objective to increase the packing density i.e. the porosity of the soot is to be reduced through reduction in the particle size. It was found that one could even use ordinary gas produced from a coking process or the like in conjunction with oxygen. The inventive method permits ultimately the production of soot layer which is optimized and adapted to the purpose.

As was mentioned in the preceding paragraphs the method permits through the stoichiometric adjustment assurance that the post treatment does not add or subtract to the layer. On the other hand, it may well be desirable in certain cases to proceed e.g. by providing at first a soot layer that is thicker than necessary and in a kind of rough or coarse process, and to use the post treatment not only to solidify but to delicately remove excess carbon. It was found e.g. that this way one could control the layer thickness from 200 micrometers down to 5 micrometers. This fine method or this refinement in thickness determination permits matching of the soot layer to the specific casting of steel or particular grade of steel.

The conditions concerning the soot layer thickness results from the period of time during which the liquid steel is expected to be in engagement with the carbon layer and that in turn depends on the casting speed. An additional factor and parameter is the heat removal from the liquid steel but that parameter is also determined by the casting speed. In either case the soot or carbon covers the cooling strip which in turn is cold or relatively cool and the layer makes sure that the cast strip at the end of the mold that runs along the cooling strip, is in fact uniformly solidified. Production period is another factor which is basically the period of time during which one can literally cast continuously i.e. without actual interruption. The inventive method permits in all these instances "tuning" of the soot layer to these conditions.

It was found that practicing the invention in a best mode configuration makes sure that the use life of a cooling strip is in fact considerably increased if thin strip or steel is being cast. It should be mentioned that among workers in the art the opinion has been voiced that flame deposit and also post treatment with soot reduces thermal conductivity and strength. The inventive method clearly contradicts this incorrect prejudice as had been voiced against flame treatment. The properties of the layer as deposited on the cooling strip and the separability from the cast product permits bending of the layer's cooling strip without removal of the heat owing to any undesired adhering to the cast product. The layer is very resistant against impingement by high speed gas, and streams.

The invention is not limited to the embodiments described above but all changes and modifications thereof, not constituting departures from the spirit and scope of the invention, are intended to be included.

We claim:

1. In a method of coating a surface expected to come in contact with liquid metal particularly steel under utilization of combusting gases produced by a flame and producing a soot layer under reducing conditions, the flame providing depositing and being oriented and directed towards said surface layer, the improvement comprising a post deposit treatment including a neutral flame which neither oxidizes nor reduces the soot layer for heating the soot layer so as to reduce in size the particles of which it is formed, to compact, strengthen and increase adhesion of the layer.

2. Method as in claim 1 including for the post treatment the generation of a flame under utilization of a gas in which combustible compound and oxygen is stoichiometrically adjusted.

3. Method as in claim 1, the improvement comprising post-treating said layer with a blend of acetylene and oxygen wherein the oxygen content is not less than required for stoichiometric relations between the oxygen and acetylene.

4. In a method of coating a surface expected to come in contact with liquid metal particularly steel under utilization of combusting gases produced by a flame and producing a soot layer under reducing conditions, the flame providing depositing and being oriented and directed towards said surface layer, the improvement comprising post-treating said layer of soot by means of a slightly oxidizing flame for compacting and strengthening the layer while removing in a controlled fashion relatively small portion of the deposited carbon owing to the oxidizing effect.

* * * * *